(12) United States Patent
Albrecht et al.

(10) Patent No.: US 10,516,221 B1
(45) Date of Patent: Dec. 24, 2019

(54) KELVIN CONNECTION MOUNTING TERMINAL

(71) Applicant: FRANKLIN GRID SOLUTIONS, LLC, Saco, ME (US)

(72) Inventors: Kenneth A. Albrecht, Zion, IL (US); Frank X. Garcia, Aurora, IL (US); Vijay Matlapudi, Woodridge, IL (US); Patrick K. Loewe, Richmond, IL (US)

(73) Assignee: Franklin Grid Solutions, LLC, Saco, ME (US)

( * ) Notice: Subject to any disclaimer, the term of this patent is extended or adjusted under 35 U.S.C. 154(b) by 0 days.

(21) Appl. No.: 16/111,656

(22) Filed: Aug. 24, 2018

(51) Int. Cl.
*H01R 9/18* (2006.01)

(52) U.S. Cl.
CPC .......... *H01R 9/18* (2013.01); *H01R 2201/20* (2013.01)

(58) Field of Classification Search
CPC ............................. H01R 9/18; H01R 2201/20
See application file for complete search history.

(56) References Cited

U.S. PATENT DOCUMENTS

| | | | | |
|---|---|---|---|---|
| 3,316,522 A * | 4/1967 | Demler, Sr. | ............... | H01R 9/00 439/288 |
| 4,354,726 A * | 10/1982 | Kato | ..................... | H01R 11/286 439/763 |
| 4,521,067 A * | 6/1985 | Dufresne | ............. | H01R 11/285 439/522 |
| 5,688,131 A * | 11/1997 | Byfield, Jr. | ............... | H01R 4/64 439/883 |
| 5,779,487 A * | 7/1998 | Gatin | ................... | H01R 11/287 439/39 |
| 5,834,696 A * | 11/1998 | Kurosawa | ............ | H01R 13/213 174/84 C |
| 5,980,334 A * | 11/1999 | Pyles | ................... | H01R 11/286 439/764 |
| 6,250,973 B1 * | 6/2001 | Lowery | ................ | H01R 11/281 439/763 |
| 6,254,438 B1 * | 7/2001 | Gaunt | .................. | H01R 11/287 439/755 |

(Continued)

FOREIGN PATENT DOCUMENTS

| JP | 2016/066587 A | 4/2016 |
|---|---|---|
| WO | WO 01/29930 A1 | 4/2001 |

OTHER PUBLICATIONS

International Search Report; PCT/US2019/045863; dated Nov. 12, 2019.
Written Opinion; PCT/US2019/045863; dated Nov. 12, 2019.

*Primary Examiner* — Truc T Nguyen
(74) *Attorney, Agent, or Firm* — Barnes & Thornburg LLP

(57) ABSTRACT

A Kelvin connector assembly is provided that includes a body assembly, a first tab and a second tab. The body assembly comprises a first electrical contact surface electrically isolated from an opposing second electrical contact surface. The body assembly defines a central opening extending through the first electrical contact surface and the second electrical contact surface that is dimensioned to receive a battery post. The first tab, which is electrically connected with the first electrical contact surface, extends from the body assembly and is configured to couple with a first quick-connect connector. The second tab, which is electrically connected with the second electrical contact surface, extends from the body assembly and is configured to couple with a second quick-connect connector.

29 Claims, 7 Drawing Sheets

(56) References Cited

U.S. PATENT DOCUMENTS

| | | | | |
|---|---|---|---|---|
| 6,343,949 B1* | 2/2002 | Floyd | ............... | H01R 11/288 |
| | | | | 439/284 |
| 6,855,008 B1* | 2/2005 | Freitag | ............. | H01H 85/044 |
| | | | | 439/620.26 |
| 6,932,650 B1* | 8/2005 | Freitag | ............. | H01R 11/287 |
| | | | | 337/188 |
| 7,160,157 B1* | 1/2007 | Jones | ................. | H01R 11/01 |
| | | | | 439/288 |
| 7,198,510 B2* | 4/2007 | Bertness | ......... | H01M 10/4285 |
| | | | | 439/500 |
| 9,257,759 B2* | 2/2016 | Nobukuni | .......... | H01R 4/305 |
| 9,923,289 B2 | 3/2018 | Bertness | | |
| 2006/0094303 A1* | 5/2006 | Perng | ................. | H01R 11/281 |
| | | | | 439/766 |
| 2008/0094068 A1* | 4/2008 | Scott | ............. | H01M 10/4285 |
| | | | | 324/426 |
| 2008/0274639 A1* | 11/2008 | Sikora | ............. | H01R 11/286 |
| | | | | 439/522 |
| 2016/0006142 A1* | 1/2016 | Okuhira | ............... | H01R 4/18 |
| | | | | 439/805 |

* cited by examiner

KELVIN CONNECTION MOUNTING TERMINAL

TECHNICAL FIELD

The present disclosure relates to electrical connectors; in particular, this disclosure relates to Kelvin connector assemblies for coupling testing devices to batteries.

BACKGROUND

A Kelvin connection is used for testing electrical equipment, such as batteries. A Kelvin connection is a four point connection technique that allows current to be injected into a battery through a first pair of electrodes attached to battery contacts while a second pair of electrodes is attached to battery contacts to measure the voltage across the posts. Separation of current and voltage electrodes eliminates voltage error that forms across the resistance of the electrode and battery post contact. This is an advantage for precise measurement of low resistance values in the micro-Ohm range.

Existing battery testing devices are available that rely on a Kelvin connection, such as a copper buss bar that is secured to the battery post with a bolt with a current carrying electrode on one end of the buss bar and a voltage sensing electrode on the other end of the bus bar for precise voltage measurements. There is difficulty on servicing battery monitoring equipment when connectors are secured to the battery post, as with existing connector devices. Unplugging the Kelvin connection between the batteries being tested and sensing device(s) is labor and time intensive. There exists a need for a Kelvin connector that allows easy removal from a battery and/or wiring harness of a battery testing device.

SUMMARY

According an embodiment of the present disclosure, a Kelvin connector assembly is provided that includes a body assembly, a first tab and a second tab. The body assembly comprises a first electrical contact surface electrically isolated from an opposing second electrical contact surface. The body assembly defines a central opening extending through the first electrical contact surface and the second electrical contact surface that is dimensioned to receive a battery post. The first tab extends from the body assembly and is configured to couple with a first quick-connect connector. The first tab is electrically connected with the first electrical contact surface. The second tab extends from the body assembly and is configured to couple with a second quick-connect connector. The second tab is electrically connected with the second electrical contact surface.

In illustrative embodiments, this disclosure provides a Kelvin connector assembly with a first terminal, a second terminal and a separator. The first and second terminals are formed from an electrically conductive material. The separator is configured to electrically separate the first terminal and the second terminal. The first terminal, the second terminal and the separator include aligned openings to define a central opening that is dimensioned to receive a battery post. The first terminal and/or the second terminal include at least one tab configured to electrically couple with a quick-connect connector.

According to another aspect, this disclosure provides a Kelvin connector assembly with a first terminal, a second terminal and a separator. The first terminal comprises a body and at least one tab extending therefrom that is configured to couple with a quick-connect connector. The second terminal comprises a body and at least one tab extending therefrom that is configured to couple with a quick-connect connector. The separator is configured to electrically separate the first terminal and the second terminal. The first terminal, the second terminal and the separator include aligned openings to define a central opening that is dimensioned to receive a battery post. The body of the first terminal has a first surface forming an electrical contact surface for the first terminal and an opposing surface adjacent the separator. The body of the second terminal has a first surface forming an electrical contact surface for the second terminal and an opposing surface adjacent the separator.

In some embodiments, a unique feature to ensure correct connector placement with Kelvin connectivity is designed in with the flat connector assembly placed on top of the battery post with angled tabs in the direction away from the battery post. Furthermore, the bottom assembly tab is a different width than the top assembly tab to ensure the current carrying electrode is connected to the bottom tab and the voltage measuring electrode is connected to the top tab for a true Kelvin connection measurement.

Additional features of the present disclosure will become apparent to those skilled in the art upon consideration of illustrative embodiments including the best mode of carrying out the disclosure as presently perceived.

BRIEF DESCRIPTION OF THE FIGURES

The detailed description makes reference to the accompanying figures in which.

DETAILED DESCRIPTION

The figures and descriptions provided herein may have been simplified to illustrate aspects that are relevant for a clear understanding of the herein described devices, systems, and methods, while eliminating, for the purpose of clarity, other aspects that may be found in typical devices, systems, and methods. Those of ordinary skill may recognize that other elements and/or operations may be desirable and/or necessary to implement the devices, systems, and methods described herein. Because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

Figure 1:
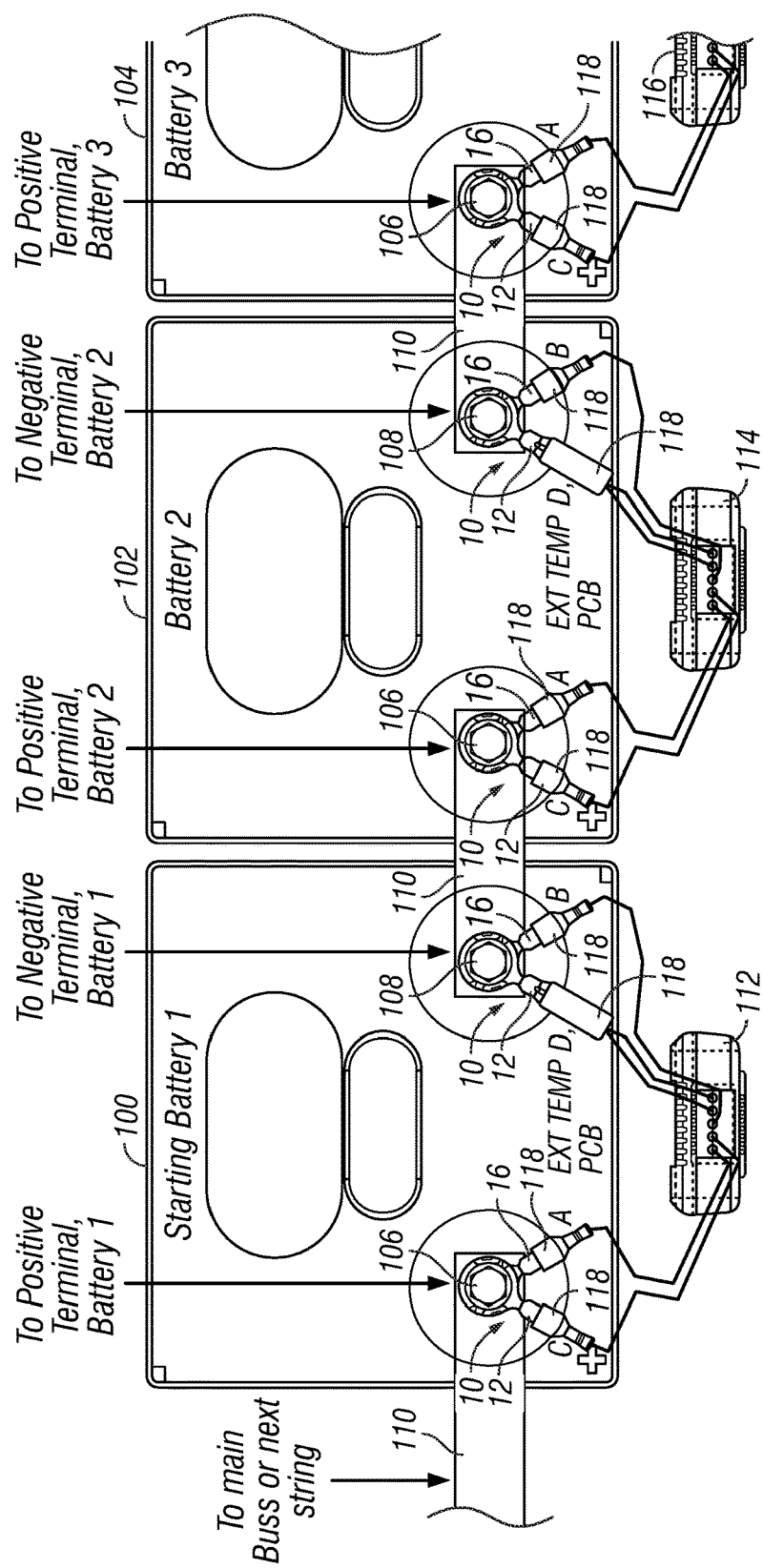
FIG. 1 is a diagrammatical view of an example battery testing configuration with a Kelvin connector assembly according to an embodiment of the present disclosure.

This disclosure relates to a Kelvin connector assembly for testing batteries. The Kelvin connector assembly allows a connection with a battery to measure various characteristics for testing, such as battery voltage, temperature and/or conductance. For purposes of example only, FIG. 1 shows an example configuration for testing certain parameters of batteries. Although this testing configuration is shown for purposes of example, the Kelvin connector assembly embodiments described herein could be used in a variety of battery testing configurations and environments.

In the example of FIG. 1, there is shown a plurality of batteries 100, 102, 104 under testing; although three batteries are shown for purposes of this example, more or less batteries could be under testing. One skilled in the art should appreciate that different types and voltages of batteries could be tested, such as 2-12 volt battery monitoring. Each of the batteries has a positive terminal 106 and a negative terminal 108. Typically, the terminals 106, 108 include threaded posts for connection. As shown, a strap 110 electrically connects the negative terminal 108 of a first battery 100 with the positive terminal 106 of the second battery 102; likewise, a strap 110 electrically connects the negative terminal 108 of a second battery 102 with the positive terminal 106 of the third battery 104.

The example testing configuration of FIG. 1 also includes a plurality of battery sensors 112, 114, 116 for measuring characteristics of the batteries 100, 102, 104. As shown, each of the battery sensors 112, 114, 116 is connected to a respective battery 100, 102, 104. In this example, a Kelvin connector assembly 10 according to one embodiment (FIGS. 2-4) is attached to each positive terminal 106 and negative terminal 108 of the batteries 100, 102, 104, such as a connection to the threaded posts of the terminals 106, 108. In the embodiment shown, the Kelvin connector assemblies 10 include a first terminal 12 and second terminal 16. As explained below, the first terminal 12 and the second terminal 16 of the Kelvin connector assembly 10 are electrically isolated from each other. This allows multiple independent electrical connections for each terminal 106, 108 of the batteries 100, 102, 104. In this example connector assembly 10, the first terminal 12 is electrically connected with the post head of the battery terminals 106, 108 while the second terminal 16 is electrically connected to the strap 110. These electrical connections to the battery terminals 106, 108 and straps 110 are electrically isolated because the first terminal 12 and second terminal 16 of the Kelvin connector assembly 10 are electrically isolated.

In this example, the battery sensors 112, 114, 116 include quick-connect connectors 118, such as Faston-type connectors, that electrically connect with terminals 12, 16 of the Kelvin connector assembly 10. Depending on the circumstances, the quick connectors could be M6 (0.25 inches), M8 (0.3125 inches), M10 (0.375 inches) or other sizes. The quick-connect connectors 118 allow certain wires of the sensors 112, 114, 116 to be easily connected and disconnected from the battery terminals 106, 108. In the example shown, some quick-connect connectors 118 include a single wire connected to the battery sensors 112, 114, 116 while other quick connectors 118 include two wires. One skilled in the art should appreciate that the quick-connect connectors 118 may include one, two, or more wires extending therefrom depending on the circumstances and/or connections needed to the sensor.

Figure 2:
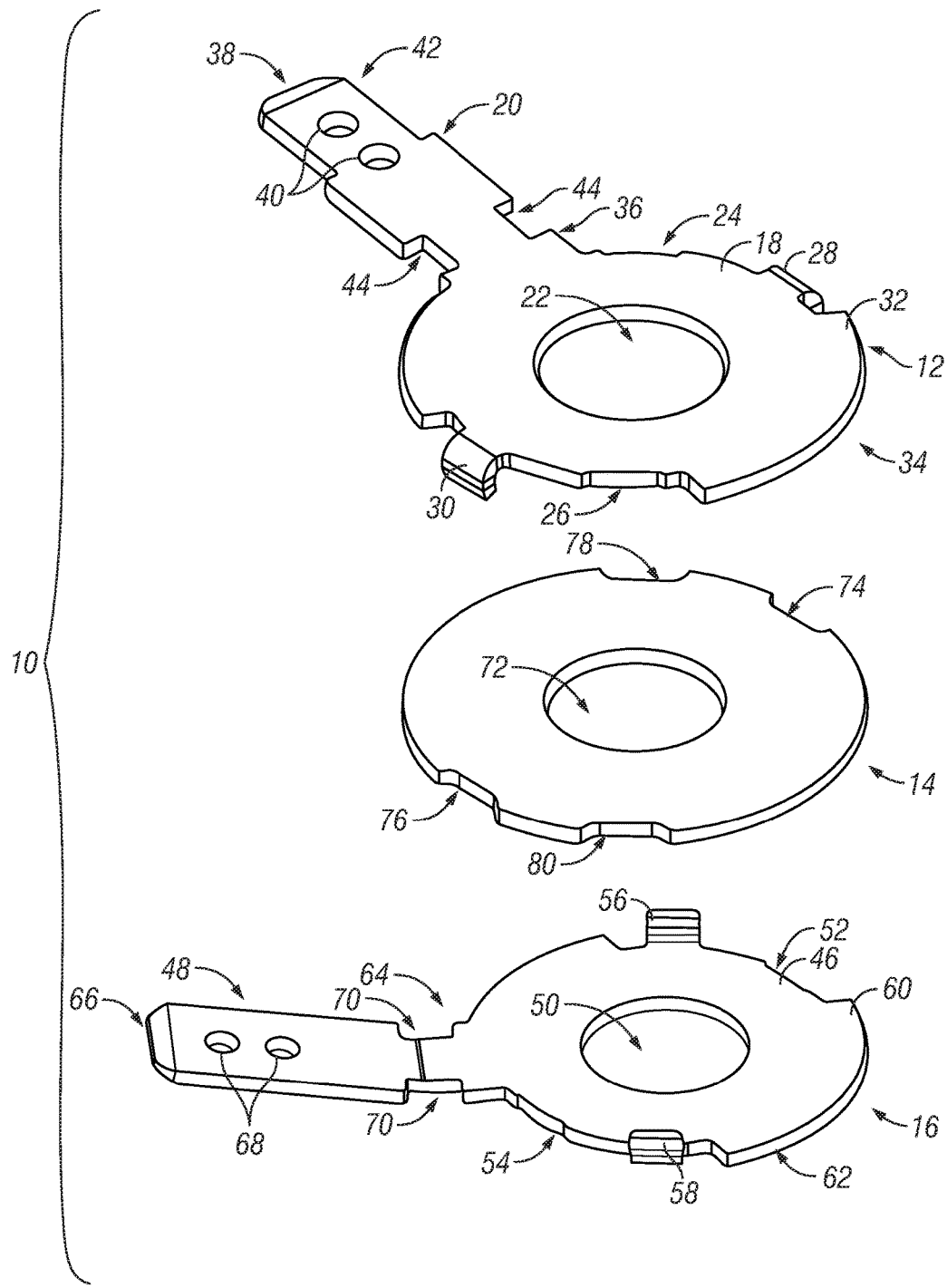
FIG. 2 is an exploded view of the example Kelvin connector assembly shown in FIG. 1.

FIG. 2 shows the embodiment of the Kelvin connector assembly 10 with two terminals shown in FIG. 1. Although this embodiment shows two terminals, other embodiments are contemplated in which there could be 3, 4 (FIGS. 6 and 7) or more terminals depending on the circumstances. In the example shown, the connector assembly 10 includes a first terminal 12, a separator 14, and a second terminal 16.

The first terminal 12 and the second terminal 16 are formed from an electrically conductive material, such as copper, brass, and/or other electrically conductive materials. The separator 14 is formed from an electrically insulating material to electrically isolate the first terminal 12 and the second terminal 16. Depending on the circumstances, the separator 14 could be formed from fiberglass, plastic, or other insulating material. Accordingly, in the embodiment shown in FIG. 2, the connector assembly 10 includes two independent electrical paths: the first terminal 12 and the second terminal 16.

The first terminal 12 includes a body 18 and a quick connection, which is in the form of a first tab 20 extending from the body 18 in the embodiment shown. In the example shown, the body 18 has a substantially ring-like shape. Although the embodiment shown has a ring shape, the body 18 could have a square, rectangular, pentagon, hexagonal, or other shape depending on the circumstances.

As shown, the body 18 defines an opening 22 dimensioned to receive a terminal post or bolt. Typically, the diameter of the opening 22 is larger than the post to prevent electrical communication between the post and the first terminal 12. The post head (and not the post shank) is typically in electrical connection with the first surface 62 of the body 18. In some embodiments, the opening 22 could be similarly dimensioned to the bolt to make an electrical connection in circumstances in which it is desirable for the opening 22 to be a different diameter than that of the opening 50 in the second terminal 16 (discussed below).

In some embodiments, the body 18 includes a first cut out portion 24 and a second cut out portion 26. The cut out portions 24, 26 are configured to prevent electrical communication between the first terminal 12 and the second terminal 16. A first clip 28 and a second clip 30 extend from the first cut out portion 24 and a second cut out portion 26, respectively, in the embodiment shown. The first clip 28 and second clip 30 are configured to couple the first terminal 12 with the separator 14. In some embodiments, the first clip 28 and second clip 30 are arranged on the body 18 opposite each other. For example, in some embodiments, an axis extending between the first clip 28 and second clip 30 may be approximately perpendicular to a longitudinal axis of the first tab 20.

As shown, the body 18 includes a first surface 32 and an opposing second surface 34. In this example, the first surface 32 creates an electrical contact between the first terminal 12 and the bolt head. The second surface 34 would contact the separator 14.

The quick connection with the first tab 20 allows an electrical connection between the first terminal 12 and another electrical component, such as a battery or sensor, to be quickly disconnected and reconnected. Although tab 20 is shown for purposes of example, numerous quick connect configurations, such as Faston-type connectors, could be used. As shown, the first tab 20 includes a proximal end 36 near the body 18 and a distal end 38 extending from the body 18. In this example, the distal end 38 is tapered to receive a quick connect connector 118. The tab 20 includes a plurality of holes or dimples 40 for dimensioned to receive one or more detents in the quick connect connector 118 to which the tab 20 connects. In this example, the first tab 20 includes a reduced width portion 42 corresponding to the size of the quick connect connector to which the first tab 20 connects. The proximal end 36 includes slots 44 corresponding to the structure to be received by the quick connect connector 118 to which the first tab 20 connects. In some embodiments, the configuration of the first tab 20 is different than that of the second tab 48 of the second terminal 16 (discussed below) to distinguish between connection types and connectors to which the tabs 20, 48 connect, which prevents a user from reversing the connectors 118 that are supposed to connect with the tabs 20, 48. In the embodiment shown, the first tab 20 is substantially coplanar with the body 18 of the first terminal 12.

The second terminal 16 has a similar configuration as the first terminal 12. The second terminal 12 includes a body 46 and a quick connection, which is in the form of a second tab 48 extending from the body 46 in the embodiment shown. In the example shown, the body 46 has a substantially ring-like shape. Although the embodiment shown has a ring shape, the body 46 could have a square, rectangular, pentagon, hexagonal, or other shape.

As shown, the body 46 defines an opening 50 dimensioned to receive a bolt. Typically, the diameter of the opening 50 is larger than the bolt to prevent electrical communication between the shank of the bolt and the second terminal 16. In some embodiments, the opening 50 could be dimensioned similarly to the bolt to make an electrical connection in circumstances in which it is desirable for the opening 50 to be a different diameter than that of the opening 22 in the first terminal 12.

In some embodiments, the body 46 includes a first cut out portion 52 and a second cut out portion 54. The cut out portions 52, 54 are configured to prevent electrical communication between the second terminal 16 and the first terminal 12. A first clip 56 and a second clip 58 extend from the first cut out portion 52 and a second cut out portion 54, respectively. The first clip 56 and second clip 58 are configured to couple the second terminal 16 to the separator 14. In some embodiments, the first clip 56 and second clip 58 are arranged on the body 46 opposite each other. For example, in some embodiments, an axis extending between the first clip 56 and second clip 58 may be approximately perpendicular to a longitudinal axis of the second tab 48.

As shown, the body 46 includes a first surface 60 and an opposing second surface 62. In this example, the first surface 60 may be installed on a substrate while the second surface 62 would contact the separator 14.

The quick connection provided by the second tab 48 allows an electrical connection between the second terminal 16 and another electrical component, such as a battery or sensor, to be quickly disconnected and reconnected. Although second tab 48 is shown for purposes of example, numerous quick connect configurations, such as Faston-type connectors, could be used. As shown, the second tab 48 includes a proximal end 64 near the body 46 and a distal end 66 extending from the body 46. In this example, the distal end 66 is tapered to receive a quick connection fastener. The second tab 48 includes a plurality of holes or dimples 68 dimensioned to receive one or more detents in the fastener to which the second tab 48 connects. In this example, the proximal end 64 includes slots 70 corresponding to the structure to be received by the fastener to which the second tab 48 connects. As discussed above, in some embodiments, the configuration of the second tab 48 could be different than that of the first tab 20 (discussed below) to distinguish between connection types and fasteners to which the tabs 20, 48 connect, which prevents the user from reversing the fasteners that are supposed to connect with the tabs 20, 48.

For example, one tab could be keyed with a 0.1875 wide Faston-type connector while the other tab could be keyed with a 0.250 wide Faston-type connector. In the embodiment shown, the longitudinal axis of the second tab 48 is angled towards the first terminal 12 with respect to a longitudinal axis of the body 46 of the second terminal 16.

The separator 14 is disposed between the first terminal 12 and the second terminal 16. As discussed above, the separator 14 is formed from an electrically insulating material to electrically isolate the first terminal 12 with respect to the second terminal 16. In the example shown, the separator includes an opening 72 dimensioned to receive a bolt. As shown, the diameter of opening 72 is smaller than openings 22, 50. This allows separator 14 to contact the bolt shank while the terminals 12, 14 do not contact the bolt shank in the embodiment shown, which resists radial movement of the connector assembly 10. The opening 72 is substantially coaxial with the openings 22, 50 of the terminals 12, 16.

In the embodiment shown, the separator includes a first groove 74, a second groove 76, a third groove 78 and a fourth groove 80. As shown, the first groove 74 is arranged on the separator 14 to correspond with the first clip 28 of the first terminal 12 and the second groove 76 corresponds with the annular location of the second clip 30. The third groove 78 corresponds with the location of the first clip 56 of the second terminal 16 and the fourth groove 80 corresponds with the annular position of the second clip 58. The grooves 74, 76, 78, 80 are dimensioned to receive the corresponding clips 28, 30, 56, 58.

Figure 3:
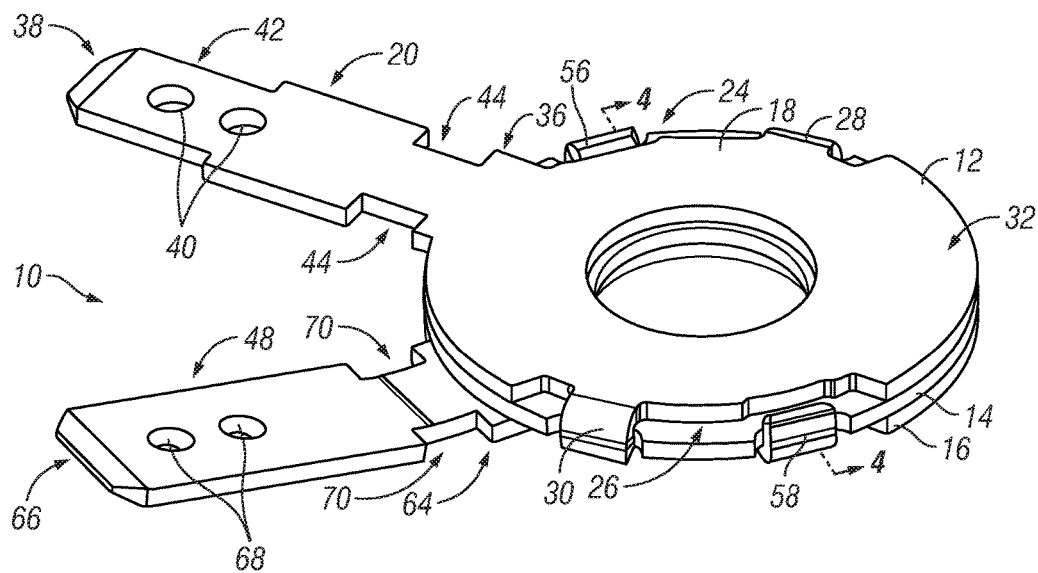
FIG. 3 is a perspective view of the example Kelvin connector assembly shown in FIG. 1.

FIG. 3 shows an assembled view of the connector assembly 10. In this view, the separator 14 can be seen disposed between the first terminal 12 in the second terminal 16. As shown, the first clip 28 of the first terminal 12 is received within the first groove 74 of the separator 14; likewise, the second clip 30 of the first terminal 12 is received within the second groove 76 of the separator. The first clip 56 of the second terminal 16 is received by the third groove 78 of the separator 14; similarly, the second coil 58 of the second terminal 16 is received by the fourth groove 80 of the separator. When assembled, the cut out portions 24, 26 of the first terminal 12 prevent electrical contact with the clips 56, 58 of the second terminal 16; likewise, the cut out portions 52, 54 of the second terminal 16 prevent electrical contact with the clips 28, 30 of the first terminal 12. This is best seen in FIG. 3 with respect to the second clip 58 of the second terminal 16 with regard to the second cut out portion 26 of the first terminal 12. As can be seen, the second clip 58 is spaced apart from the edge of the first terminal 12 due to the second cut out portion 26. Also shown in the embodiment of FIG. 3 is that the clips 28, 30 in the first terminal 12 extend in an opposite direction than the clips 56, 58 of the second terminal 16.

In the example shown in FIG. 3, the bodies 18, 46 of terminals 12, 16 are planar sheet-like portions layered around separator 14, which is also planar sheet-like shape in this embodiment. Although these layers are physically connected together using clips 28, 30, 56, 58, the central layer (separator 14) electrically isolates the upper layer (first terminal 12) and the bottom layer (second terminal 16). As shown, the first surface 32 (FIG. 2) of the first terminal 12 is the electrical contact surface for the first terminal 12 electrically connecting with the post head of battery terminals 106, 108. The second surface 62 (FIG. 2) is the electrical contact surface for the second terminal 16 electrically connecting with strap 110.

Figure 4:
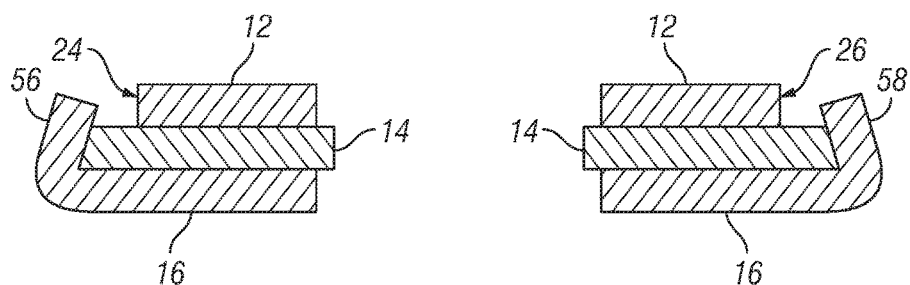
FIG. 4 is a cross-section view of the example Kelvin connector assembly shown in FIG. 3 along line 4-4.

FIG. 4 shows a cross-sectional view along line 4-4 of FIG. 3. In this view, the smaller diameter of opening 72 in the separator 14 can be seen compared to the opening 22, 50 in the terminals 12, 16. As discussed above, this prevents an electrical connection between a battery post and either of the terminals 12, 16. Also seen in this view is the space between the clips 56, 58 in the second terminal 16 caused by cut outs 24, 26 in the first terminal 12 to prevent electrical connection therebetween. The top edges of 56 and 58 are clinched, crimped, stamped or by some other means, reduced below the surfaces 12, and on the underside, 16, such that conduction is prevented between surfaces 12 and 16 through inadvertent contact with either the bolt head, washer, strap or battery terminal.

Figure 5:
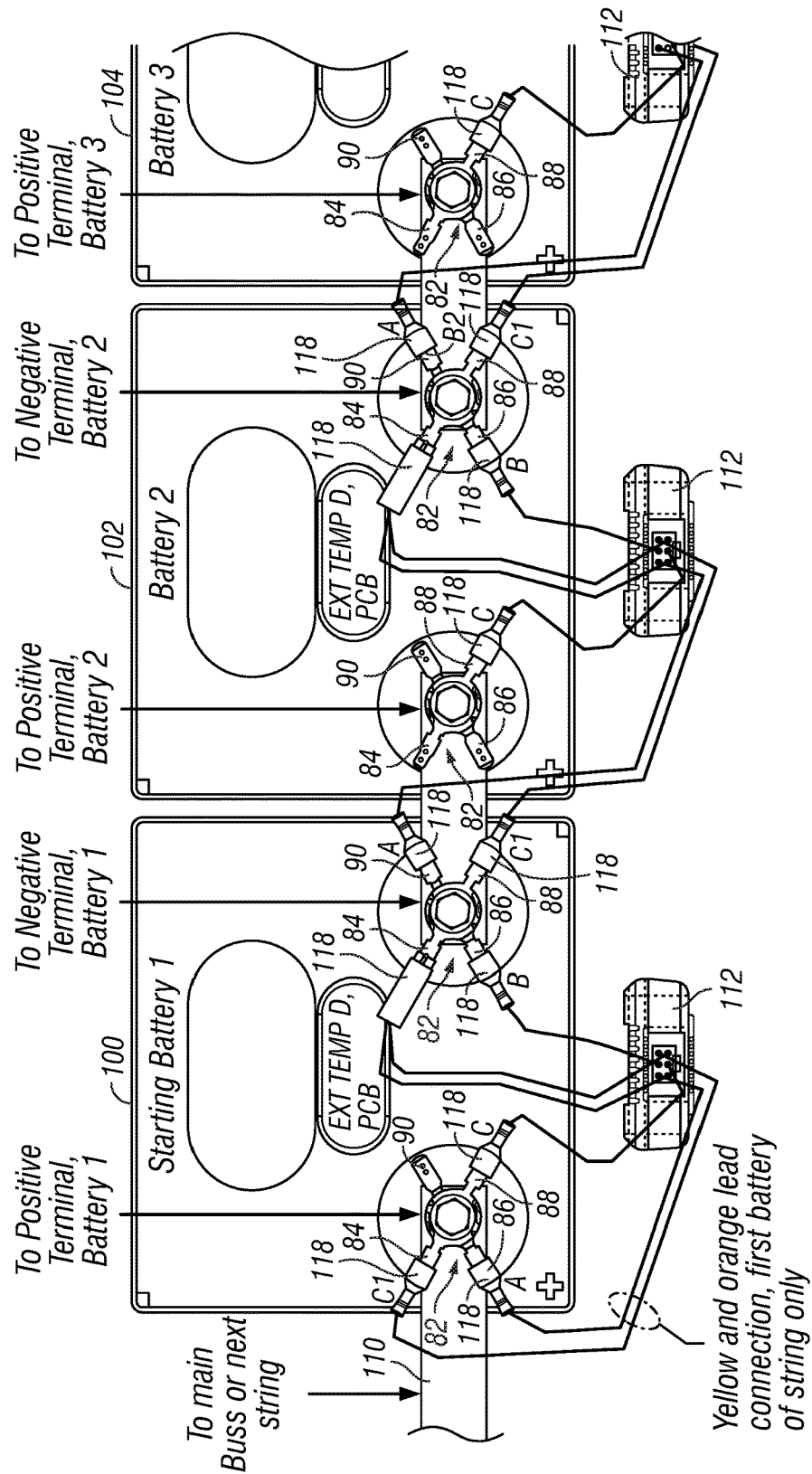
FIG. 5 is a diagrammatical view of an example battery testing configuration with a Kelvin connector assembly according to another embodiment of the present disclosure.

FIG. 5 illustrates another example battery testing configuration using a Kelvin connector assembly 82 according to another embodiment that includes additional tabs for making connections to the connector assembly 82. In this example, the connector assembly 82 includes a first tab 84, a second tab 86, a third tab 88, and a fourth tab 90. In this embodiment, the first tab 84 is electrically connected with the third tab 88 while the second tab 86 is electrically connected with the fourth tab 90. The first tab 84 and third tab 88 are electrically isolated from the second tab 86 and the fourth tab 90. There are two electrically isolated paths, but in this embodiment, there are multiple tabs for each isolated path. As with the embodiment discussed above, each of the tabs 84, 86, 88, 90 are configured to be connected with a quick-connect connector, such as a Faston-type connector. Depending on the circumstances, each quick-connect connector may have one or more wires connected thereto. This embodiment allows another configuration in how to connect an electrical component, such as a sensor and/or battery to the Kelvin connector assembly 82.

Figure 6:
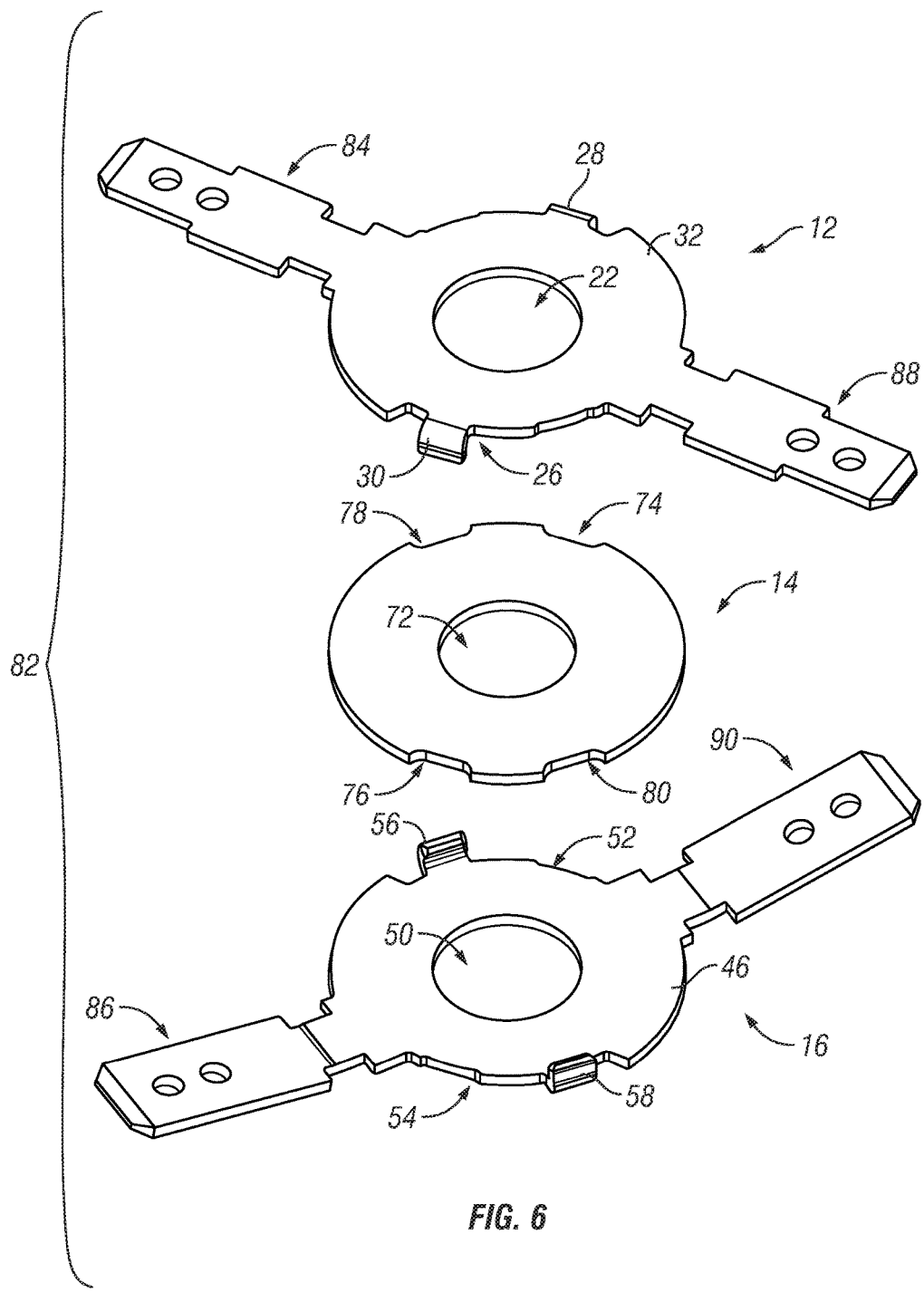
FIG. 6 is an exploded view of the example Kelvin connector assembly shown in FIG. 5.
Figure 7:
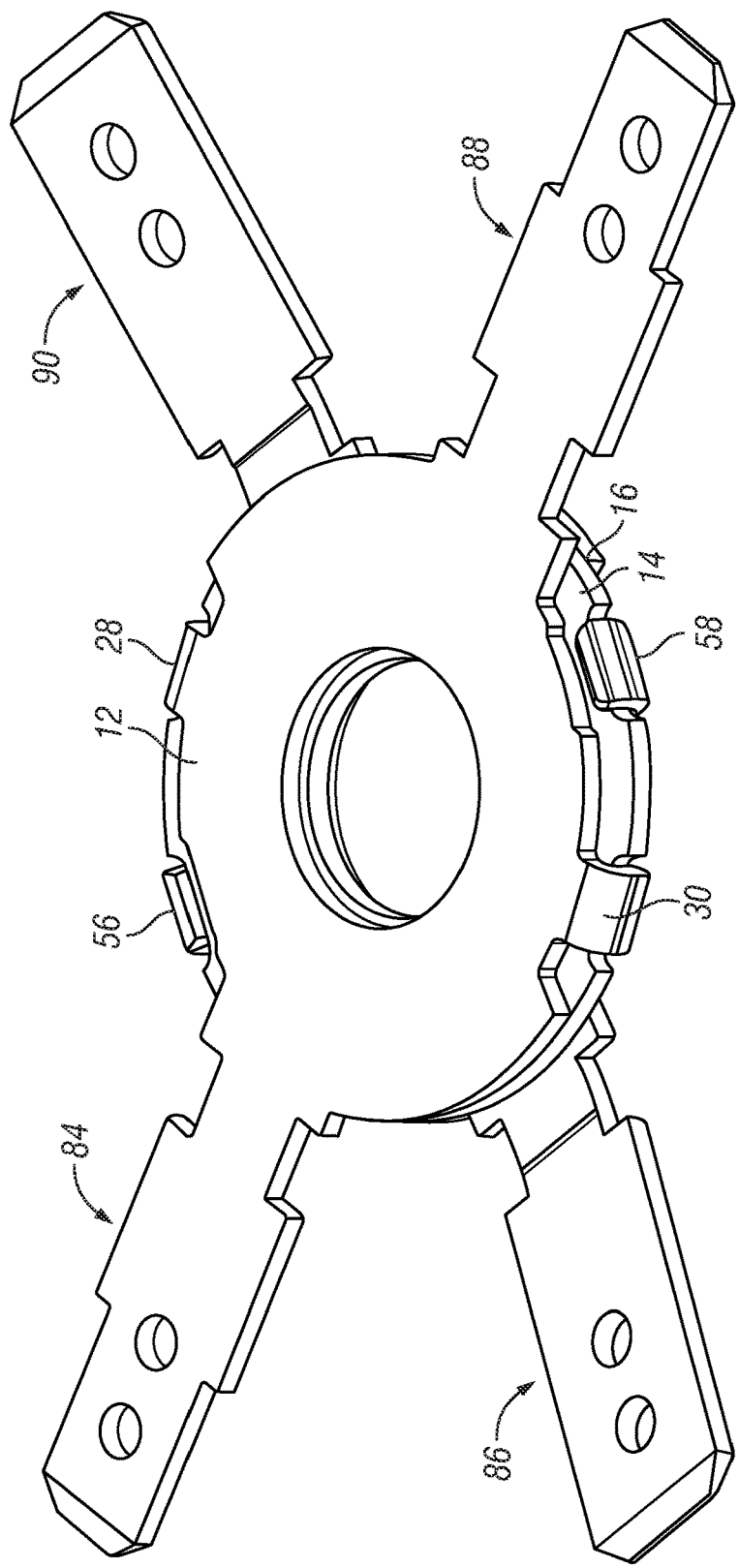
FIG. 7 is a perspective view of the example Kelvin connector assembly shown in FIG. 5.

FIGS. 6 and 7 show the embodiment of the Kelvin connector assembly 82 according to the embodiment shown in FIG. 5. Due to the similarity of this embodiment with the embodiment of the Kelvin connector assembly 10 shown in FIGS. 1-4, like components are shown with the same reference number. These components have a similar function as described above with regard to the embodiment of connector assembly 10 shown in FIGS. 1-4.

In the embodiment shown in FIGS. 6 and 7, the first terminal 12 includes a first tab 84 and a third tab 88 while the second terminal includes a second tab 86 and a fourth tab 90. As discussed above, the tabs 84, 86, 88, 90 are configured to receive a quick connector. The first tab 84 and third tab 88 are electrically connected; likewise, the second tab 86 and the fourth tab 90 are electrically connected. However, the separator 14 electrically isolates the first/third tabs 84, 88 from the second/fourth tabs 86, 90.

The first tab 84 and third tab 88 extend radially from the body 18 of the first terminal 12. As shown, the first tab 84 and the third tab 88 are coplanar with the body 18 and extend coaxially along a longitudinal axis of the tabs 84, 88. In the embodiment shown, the second tab 86 and the fourth tab 90 extend radially from the body 46 of the second terminal 16. In this embodiment, the tabs 86, 90 are angled with regard to the plane of the body 46.

Figure 8:
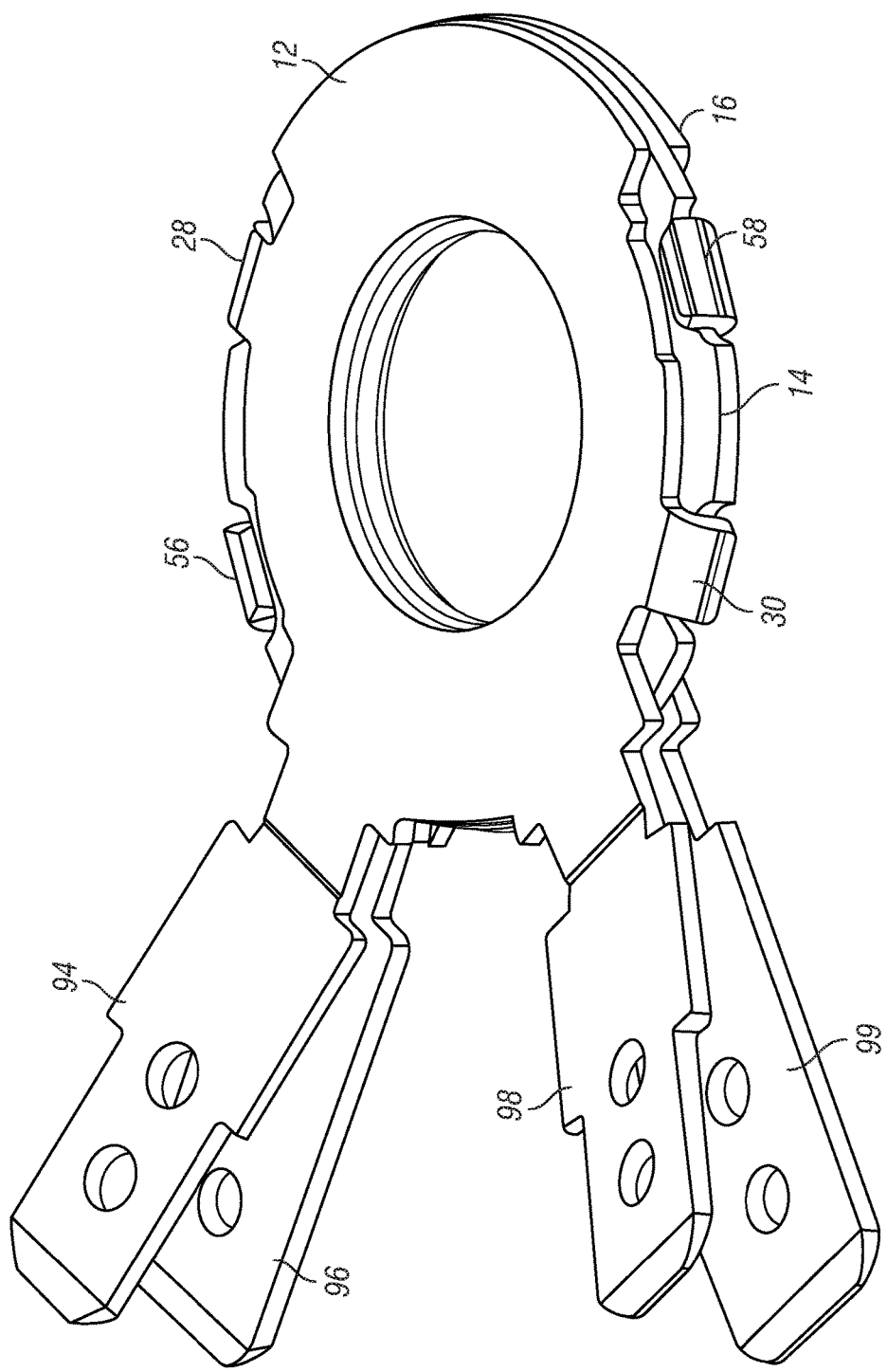
FIG. 8 is a perspective view of an example Kelvin connector assembly according to another embodiment of the present disclosure.

FIG. 8 shows a Kelvin connector assembly 92 according to another embodiment. In this embodiment, the first terminal 12 includes a first tab 94 that is coplanar with a second tab 96 of the second terminal 16 and a third tab 98 that is coplanar with a fourth tab 99 of the second terminal 16. As with the other embodiments, the tabs 94, 96, 98, 99 are configured to be connected with a quick connect connector, such as a Faston-type connector. As shown, the first tab and third tab 98 are electrically connected while the second tab 96 and the fourth tab 99 are electrically connected. However, the first/third tabs 94, 98 of the first terminal 12 are electrically isolated with the second/fourth tabs 96, 99 of the second terminal. This embodiment provides another tab configuration that could be used depending on the circumstances.

Examples

Illustrative examples of the Kelvin connector assembly disclosed herein are provided below. An embodiment of the Kelvin connector assembly may include any one or more, and any combination of, the examples described below.

Example 1 is a Kelvin connector assembly with a body assembly, a first tab and a second tab. The body assembly comprises a first electrical contact surface electrically isolated from an opposing second electrical contact surface. The body assembly defines a central opening extending through the first electrical contact surface and the second electrical contact surface that is dimensioned to receive a battery post. The first tab extends from the body assembly and is configured to couple with a first quick-connect connector. The first tab is electrically connected with the first electrical contact surface. The second tab extends from the body assembly and is configured to couple with a second quick-connect connector. The second tab is electrically connected with the second electrical contact surface.

In Example 2, the subject matter of Example 1 is further configured such that the first tab is configured to couple with a quick-connect connector of a different configuration than the second tab.

In Example 3, the subject matter of Example 1 is further configured such that the body assembly is substantially planar.

In Example 4, the subject matter of Example 3 is further configured such that the body assembly includes a first electrically conductive layer and a second electrically conductive layer separated by an insulating layer. The insulating layer is configured to electrically isolate the first electrically conductive layer and the second electrically conductive layer.

In Example 5, the subject matter of Example 4 is further configured such that the first electrically conductive layer forms at least a portion of the first electrical contact surface and the second electrically conductive layer forms at least a portion of the second electrical contact surface.

In Example 6, the subject matter of Example 3 is further configured such that the first electrically conductive layer and/or the second electrically conductive layer include one or more clips to couple the first electrically conductive layer, the second electrically conductive layer and the insulating layer together.

In Example 7, the subject matter of Example 1 further includes a third tab extending from the body assembly configured to couple with a third quick-connect connector. The third tab is electrically connected with the first electrical contact surface.

In Example 8, the subject matter of Example 7 further includes a fourth tab extending from the body assembly configured to couple with a fourth quick-connect connector. The fourth tab is electrically connected with the second electrical contact surface.

In Example 9, the subject matter of Example 1 is further configured such that the body assembly has substantially a ring-shape.

Example 10 is a kelvin connector assembly with a first terminal, a second terminal and a separator. The first and second terminals are formed from an electrically conductive material. The separator is configured to electrically separate the first terminal and the second terminal. The first terminal, the second terminal and the separator include aligned openings to define a central opening that is dimensioned to receive a battery post. The first terminal and/or the second terminal include at least one tab configured to electrically couple with a quick-connect connector.

In Example 11, the subject matter of Example 10 is further configured such that the first terminal includes a body with a first surface configured to be an electrical contact surface for the first terminal and an opposing second surface adjacent the separator.

In Example 12, the subject matter of Example 11 is further configured such that the second terminal includes a body with a first surface configured to be an electrical contact surface for the second terminal and an opposing second surface adjacent the separator.

In Example 13, the subject matter of Example 10 is further configured such that a diameter of the opening of the separator is smaller than the openings of the first terminal and the second terminal.

In Example 14, the subject matter of Example 10 is further configured such that the body of the first terminal and/or the second terminal includes one or more clips configured to couple the separator, first terminal and second terminal together.

In Example 15, the subject matter of Example 14 is further configured such that the first terminal includes one or more clips extending from the body in a first direction and the second terminal includes one or more clips extending from the body in a second direction. The first direction is substantially in an opposite direction from the second direction.

In Example 16, the subject matter of Example 15 is further configured such that the separator includes one or more grooves configured to receive one or more clips extending from the body of the first terminal and/or the second terminal.

In Example 17, the subject matter of Example 16 is further configured such that the one or more grooves of the separator is annularly arranged corresponding with an annular position of the one or more clips extending from the body of the first terminal and/or the second terminal.

In Example 18, the subject matter of Example 14 is further configured such that one or more clips of the first terminal and/or one the second terminal engage a peripheral edge of the separator.

In Example 19, the subject matter of Example 14 is further configured such that the body of the first terminal includes at least one cut-out portion annularly positioned corresponding with an annular position of at least one clip extending from the body of the second terminal and the body of the second terminal includes at least one cut-out portion annularly positioned corresponding with an annular position of at least one clip extending from the body of the first terminal.

Example 20 is a Kelvin connector assembly with a first terminal, a second terminal and a separator. The first terminal comprises a body and at least one tab extending therefrom that is configured to couple with a quick-connect connector. The second terminal comprises a body and at least one tab extending therefrom that is configured to couple with a quick-connect connector. The separator is configured to electrically separate the first terminal and the second terminal. The first terminal, the second terminal and the separator include aligned openings to define a central opening that is dimensioned to receive a battery post. The body of the first terminal has a first surface forming an electrical contact surface for the first terminal and an opposing surface adjacent the separator. The body of the second terminal has a first surface forming an electrical contact surface for the second terminal and an opposing surface adjacent the separator.

Although certain embodiments have been described and illustrated in exemplary forms with a certain degree of particularity, it is noted that the description and illustrations have been made by way of example only. Numerous changes in the details of construction, combination, and arrangement of parts and operations may be made. Accordingly, such changes are intended to be included within the scope of the disclosure, the protected scope of which is defined by the claims.

What is claimed is:

1. A Kelvin connector assembly comprising:
   a body assembly comprising a first electrical contact surface electrically isolated from an opposing second electrical contact surface, the body assembly defining a central opening extending through the first electrical contact surface and the second electrical contact surface that is dimensioned to receive a battery post, wherein the central opening is dimensioned larger than a dimension of the battery post to prevent electrical connection therebetween;
   a first tab extending from the body assembly configured to couple with a first quick-connect connector, wherein the first tab is electrically connected with the first electrical contact surface;
   a second tab extending from the body assembly configured to couple with a second quick-connect connector, wherein the second tab is electrically connected with the second electrical contact surface; and
   an insulator located between the first tab and the second tab, wherein the insulator has a central opening aligned with the central opening of the body assembly, wherein the central opening of the insulator has a smaller diameter dimension than the central opening of the body assembly to electrically isolate the inner surfaces of the body assembly from the bolt to enhance a Kelvin connection.

2. The connector assembly of claim 1, wherein the first tab is configured to couple with a quick-connect connector of a different configuration than the second tab.

3. The connector assembly of claim 1, wherein the body assembly is substantially planar.

4. The connector assembly of claim 1, further comprising a third tab extending from the body assembly configured to couple with a third quick-connect connector, wherein the third tab is electrically connected with the first electrical contact surface.

5. The connector assembly of claim 1, wherein the body assembly has substantially a ring-shape.

6. The connector assembly of claim 3, wherein the body assembly includes a first electrically conductive layer and a second electrically conductive layer separated by an insulating layer, wherein the insulating layer is configured to electrically isolate the first electrically conductive layer and the second electrically conductive layer.

7. The connector assembly of claim 3, wherein the first electrically conductive layer and/or the second electrically conductive layer include one or more clips to couple the first electrically conductive layer, the second electrically conductive layer and the insulating layer together.

8. The connector assembly of claim 6, wherein the first electrically conductive layer forms at least a portion of the first electrical contact surface and the second electrically conductive layer forms at least a portion of the second electrical contact surface.

9. The connector assembly of claim 4, further comprising a fourth tab extending from the body assembly configured to couple with a fourth quick-connect connector, wherein the fourth tab is electrically connected with the second electrical contact surface.

10. A Kelvin connector assembly comprising:
a body assembly comprising a first electrical contact surface electrically isolated from an opposing second electrical contact surface, the body assembly defining a central opening extending through the first electrical contact surface and the second electrical contact surface that is dimensioned to receive a battery post, wherein the first electrical contact surface is configured to make an electrical connection with a battery post base, and the second electrical contact surface is configured to make an electrical connection with the battery post for a proper Kelvin connection;
a first tab extending from the body assembly configured to couple with a first quick-connect connector, wherein the first tab is electrically connected with the first electrical contact surface;
a second tab extending from the body assembly configured to couple with a second quick-connect connector, wherein the second tab is electrically connected with the second electrical contact surface wherein a width of the first tab is different than a width of the second tab to key each of the tabs to a different quick-connect connector type; and
an insulator located between the first tab and the second tab.

11. The connector assembly of claim 10, wherein the central opening is dimensioned larger than a dimension of the battery post to prevent electrical connection therebetween.

12. The connector assembly of claim 10, wherein the first tab is configured to couple with a quick-connect connector of a different configuration than the second tab.

13. The connector assembly of claim 10, wherein the body assembly is substantially planar.

14. The connector assembly of claim 10, further comprising a third tab extending from the body assembly configured to couple with a third quick-connect connector, wherein the third tab is electrically connected with the first electrical contact surface.

15. The connector assembly of claim 10, wherein the body assembly has substantially a ring-shape.

16. The connector assembly of claim 11, wherein the insulator has a central opening aligned with the central opening of the body assembly, wherein the central opening of the insulator has a smaller diameter dimension than the central opening of the body assembly to electrically isolate the inner surfaces of the body assembly from the bolt to enhance a Kelvin connection.

17. The connector assembly of claim 13, wherein the body assembly includes a first electrically conductive layer and a second electrically conductive layer separated by an insulating layer, wherein the insulating layer is configured to electrically isolate the first electrically conductive layer and the second electrically conductive layer.

18. The connector assembly of claim 13, wherein the first electrically conductive layer and/or the second electrically conductive layer include one or more clips to couple the first electrically conductive layer, the second electrically conductive layer and the insulating layer together.

19. The connector assembly of claim 17, wherein the first electrically conductive layer forms at least a portion of the first electrical contact surface and the second electrically conductive layer forms at least a portion of the second electrical contact surface.

20. The connector assembly of claim 14, further comprising a fourth tab extending from the body assembly configured to couple with a fourth quick-connect connector, wherein the fourth tab is electrically connected with the second electrical contact surface.

21. A Kelvin connector assembly comprising:
a first terminal formed from an electrically conductive material;
a second terminal formed from an electrically conductive material;
an insulator configured to electrically separate the first terminal and the second terminal;
wherein the first terminal, the second terminal and the insulator include aligned openings to define a central opening that is dimensioned to receive a battery post, wherein a diameter of the opening of the insulator is smaller than the openings of the first terminal and the second terminal; and
wherein the first terminal and/or the second terminal include at least one tab configured to electrically couple with a quick-connect connector.

22. The connector assembly of claim 21, wherein the first terminal includes a body with a first surface configured to be an electrical contact surface for the first terminal and an opposing second surface adjacent the insulator.

23. The connector assembly of claim 22, wherein the second terminal includes a body with a first surface configured to be an electrical contact surface for the second terminal and an opposing second surface adjacent the insulator.

24. The connector assembly of claim 22, wherein the body of the first terminal and/or the second terminal includes one or more clips configured to couple the insulator, first terminal and second terminal together.

25. The connector assembly of claim 24, wherein one or more clips of the first terminal and/or one the second terminal engage a peripheral edge of the insulator.

26. The connector assembly of claim 24, wherein the body of the first terminal includes at least one cut-out portion annularly positioned corresponding with an annular position of at least one clip extending from the body of the second terminal and the body of the second terminal includes at least one cut-out portion annularly positioned corresponding with an annular position of at least one clip extending from the body of the first terminal.

27. A Kelvin connector assembly comprising:
a first terminal formed from an electrically conductive material;
a second terminal formed from an electrically conductive material;
an insulator configured to electrically separate the first terminal and the second terminal wherein a body of the first terminal and/or the second terminal includes one or more clips configured to couple the insulator, first terminal and second terminal together;
wherein the first terminal, the second terminal and the insulator include aligned openings to define a central opening that is dimensioned to receive a battery post; and
wherein the first terminal and/or the second terminal include at least one tab configured to electrically couple with a quick-connect connector;

wherein the first terminal includes one or more clips extending from the body in a first direction and the second terminal includes one or more clips extending from the body in a second direction, wherein the first direction is substantially in an opposite direction from the second direction.

28. The connector assembly of claim 27, wherein the insulator includes one or more grooves configured to receive one or more clips extending from the body of the first terminal and/or the second terminal.

29. The connector assembly of claim 28, wherein the one or more grooves of the insulator is annularly arranged corresponding with an annular position of the one or more clips extending from the body of the first terminal and/or the second terminal.

* * * * *